US010074781B2

(12) United States Patent
Wilcox et al.

(10) Patent No.: US 10,074,781 B2
(45) Date of Patent: Sep. 11, 2018

(54) SEMICONDUCTOR LIGHT EMITTING DEVICES INCLUDING MULTIPLE RED PHOSPHORS THAT EXHIBIT GOOD COLOR RENDERING PROPERTIES WITH INCREASED BRIGHTNESS

(71) Applicant: Cree, Inc., Durham, NC (US)

(72) Inventors: Robert Wilcox, Rolesville, NC (US); Brian Thomas Collins, Holly Springs, NC (US)

(73) Assignee: Cree, Inc., Durham, NC (US)

( * ) Notice: Subject to any disclaimer, the term of this patent is extended or adjusted under 35 U.S.C. 154(b) by 353 days.

(21) Appl. No.: 14/471,697

(22) Filed: Aug. 28, 2014

(65) Prior Publication Data
US 2015/0060922 A1 Mar. 5, 2015

Related U.S. Application Data

(60) Provisional application No. 61/871,655, filed on Aug. 29, 2013.

(51) Int. Cl.
| H05B 33/14 | (2006.01) |
| H01L 51/54 | (2006.01) |
| H01L 33/50 | (2010.01) |
| C09K 11/08 | (2006.01) |
| C09K 11/77 | (2006.01) |

(52) U.S. Cl.
CPC ........ *H01L 33/504* (2013.01); *C09K 11/0883* (2013.01); *C09K 11/7734* (2013.01); *H01L 33/502* (2013.01)

(58) Field of Classification Search
CPC . H01L 33/504; H01L 33/502; C09K 11/0883; C09K 11/7734
See application file for complete search history.

(56) References Cited

U.S. PATENT DOCUMENTS

| 6,600,175 | B1 | 7/2003 | Baretz et al. |
| 6,621,211 | B1 | 9/2003 | Srivastava et al. |
| 6,700,322 | B1 | 3/2004 | Duggal et al. |
| 8,747,697 | B2 | 6/2014 | Clatterbuck et al. |
| 2005/0093007 | A1 | 5/2005 | Steigerwald et al. |
| 2005/0093442 | A1 | 5/2005 | Setlur et al. |
| 2006/0045832 | A1 | 3/2006 | Nagatomi et al. |
| 2006/0284196 | A1 | 12/2006 | Setlur et al. |
| 2007/0158668 | A1 | 7/2007 | Tarsa et al. |
| 2007/0259206 | A1 | 11/2007 | Oshio |
| 2008/0173884 | A1 | 7/2008 | Chitnis et al. |

(Continued)

FOREIGN PATENT DOCUMENTS

| WO | WO2011115032 A1 | 9/2011 | |
| WO | WO 2012/077448 A1 | 6/2012 | |
| WO | WO 2014019758 A1 * | 2/2014 | ......... C09K 11/0883 |

*Primary Examiner* — Donald Raleigh
(74) *Attorney, Agent, or Firm* — Myers Bigel, P.A.

(57) ABSTRACT

A light emitting device includes a light emitting diode chip ("LED") that emits light having a dominant wavelength in the blue color range and a recipient luminophoric medium that is configured to down-convert at least some of the light emitted by the LED. The recipient luminophoric medium includes a green phosphor, a yellow phosphor, a first red phosphor having a first dominant wavelength and a second red phosphor having a second dominant wavelength that is different from the first dominant wavelength.

25 Claims, 7 Drawing Sheets

(56) References Cited

U.S. PATENT DOCUMENTS

| | | |
|---|---|---|
| 2008/0179611 A1 | 7/2008 | Chitnis et al. |
| 2008/0185956 A1* | 8/2008 | Hiramatsu ............ C01B 33/20 |
| | | 313/498 |
| 2008/0191610 A1 | 8/2008 | Oshio |
| 2009/0108281 A1 | 4/2009 | Keller et al. |
| 2009/0184616 A1 | 7/2009 | van de Ven et al. |
| 2010/0123104 A1 | 5/2010 | Collins et al. |
| 2011/0220929 A1 | 9/2011 | Collins et al. |
| 2011/0278605 A1 | 11/2011 | Agatani et al. |
| 2012/0112626 A1* | 5/2012 | Sakuta ................ H01L 33/504 |
| | | 313/501 |
| 2012/0193649 A1 | 8/2012 | Donofrio et al. |
| 2012/0286304 A1 | 11/2012 | LeToquin et al. |
| 2012/0305958 A1 | 12/2012 | Seibel, II et al. |
| 2012/0306355 A1 | 12/2012 | Seibel, II |
| 2012/0313124 A1* | 12/2012 | Clatterbuck ......... H01L 33/502 |
| | | 257/98 |
| 2013/0001628 A1 | 1/2013 | Yamakawa et al. |
| 2013/0193836 A1 | 8/2013 | Seibel, II et al. |
| 2013/0257266 A1* | 10/2013 | Ishizaki ............... H01L 33/504 |
| | | 313/503 |
| 2015/0204492 A1* | 7/2015 | Bichler ............ C09K 11/0883 |
| | | 362/84 |

* cited by examiner

SEMICONDUCTOR LIGHT EMITTING DEVICES INCLUDING MULTIPLE RED PHOSPHORS THAT EXHIBIT GOOD COLOR RENDERING PROPERTIES WITH INCREASED BRIGHTNESS

CLAIM OF PRIORITY

The present application claims priority from U.S. Provisional Patent Application Ser. No. 61/871,655, entitled Semiconductor Light Emitting Devices Including Multiple Red Phosphors That Exhibit Good Color Rendering Properties With Increased Brightness, filed Aug. 29, 2013, the disclosure of which is hereby incorporated by reference herein in its entirety. The present application is related to U.S. application Ser. No. 13/719,645, entitled Enhanced Luminous Flux Semiconductor Light Emitting Devices Including Red Phosphors That Exhibit Good Color Rendering Properties And Related Red Phosphors, filed Dec. 19, 2012 and U.S. Application No. 61/813,977, entitled Semiconductor Light Emitting Devices Including Red Phosphors That Exhibit Good Color Rendering Properties And Related Red Phosphors, filed Apr. 19, 2013, the disclosures of which are incorporated herein by reference in their entirety.

BACKGROUND

The present invention relates to light emitting devices and, more particularly, to semiconductor light emitting devices that include red phosphors that exhibit good color rendering properties and can achieve high luminous flux values.

Light emitting diodes ("LEDs") are solid state lighting devices that are capable of generating light. LEDs include both semiconductor-based LEDs and organic LEDs (which are often referred to as OLEDs). Semiconductor-based LEDs generally include a plurality of semiconductor layers that may be epitaxially grown on a semiconductor or non-semiconductor substrate such as, for example, sapphire, silicon, silicon carbide, gallium nitride or gallium arsenide substrates. One or more semiconductor p-n junctions are formed in these epitaxial layers. When a sufficient voltage is applied across the p-n junction, electrons in the n-type semiconductor layers and holes in the p-type semiconductor layers flow toward the p-n junction. As the electrons and holes flow toward each other, some of the electrons will recombine. Each time this occurs, a photon of light is emitted, which is how LEDs generate light. The wavelength distribution of the light generated by an LED generally depends on the semiconductor materials used and the structure of the thin epitaxial layers that make up the "active region" of the device (i.e., the area where the electrons and holes recombine).

The "peak" wavelength of an LED refers to the single wavelength where the radiometric emission spectrum of the LED reaches its maximum as detected by a photo-detector. LEDs typically have a narrow wavelength distribution that is tightly centered about their "peak" wavelength. For example, the spectral power distributions of a typical LED may have a full width of, for example, about 10-30 nm, where the width is measured at half the maximum illumination (referred to as the full width half maximum or "FWHM" width). LEDs may also be identified by their "dominant" wavelength, which is the wavelength where the radiometric emission spectrum of the LED, as perceived by the human eye, reaches its maximum value. The dominant wavelength thus differs from the peak wavelength in that the dominant wavelength takes into account the sensitivity of the human eye to different wavelengths of light.

As most LEDs are nearly monochromatic light sources that appear to emit light having a single color, LED-based light emitting devices that include multiple LEDs that emit light of different colors have been used in order to provide solid state light emitting devices that generate white light. In these devices, the different colors of light emitted by the individual LEDs combine to produce a desired intensity and/or color of white light. For example, by simultaneously energizing red, green and blue light emitting LEDs, the resulting combined light may appear white, or nearly white, depending on, for example, the relative intensities, peak wavelength and spectral power distributions of the source red, green and blue LEDs.

White light may also be produced by surrounding a single-color LED with a luminescent material that converts some of the light emitted by the LED to light of other colors. The combination of the light emitted by the single-color LED that passes through the luminescent material along with the light of different colors that is emitted by the luminescent material may produce a white or near-white light. For example, a single blue-emitting LED chip (e.g., made of indium gallium nitride and/or gallium nitride) may be used in combination with a yellow phosphor, polymer or dye such as for example, cerium-doped yttrium aluminum garnet (which has the chemical formula $Y_3Al_5O_{12}$:Ce, which is referred to herein as a "YAG:Ce" phosphor), that "down-converts" the wavelength of some of the blue light emitted by the LED, changing its color to yellow. In a blue LED/yellow phosphor lamp, the blue LED produces an emission with a dominant wavelength in the blue region, and the phosphor produces yellow fluorescence with a peak wavelength of, for example, about 550 nanometers in response to the blue emission. Some of the blue light passes through the phosphor (and/or between the phosphor particles) without being down-converted, while a substantial portion of the light is absorbed by the phosphor, which becomes excited and emits light across a broad spectrum that has a peak wavelength in the yellow color range (i.e., the blue light is down-converted to yellow light). The combination of blue light and yellow light may appear white to an observer. Such light is typically perceived as being cool white in color. In another approach, light from a violet or ultraviolet emitting LED may be converted to white light by surrounding the LED with multicolor phosphors or dyes. In either case, red-emitting phosphor particles may also be added to improve the color rendering properties of the light, i.e., to make the light appear more "warm," particularly when the single color LED emits blue or ultraviolet light.

LEDs are used in a host of applications including, for example, backlighting for liquid crystal displays, indicator lights, automotive headlights, flashlights, specialty lighting applications and even as replacements for conventional incandescent and/or fluorescent lighting in general lighting and illumination applications. In many of these applications, it may be desirable to use luminescent materials to provide a lighting source that generates light having specific properties.

SUMMARY

A light emitting device according to some embodiments includes a light emitting diode chip ("LED") that emits light having a dominant wavelength in the blue color range; and a recipient luminophoric medium that is configured to down-convert at least some of the light emitted by the LED.

The recipient luminophoric medium includes a green phosphor that down-converts the radiation emitted by the LED to radiation having a dominant wavelength that is between about 525 nanometers and about 550 nanometers; a yellow phosphor that down-converts the radiation emitted by the LED to radiation having a dominant wavelength that is between about 550 nanometers and about 580 nanometers, a first red phosphor having a first dominant wavelength and a second red phosphor having a second dominant wavelength that is different from the first dominant wavelength.

In some embodiments, a first red phosphor in the phosphor composition may have an emission spectrum with a first dominant wavelength, and a second red phosphor in the phosphor composition may have an emission spectrum with a second dominant wavelength that is at least about 10 nm different than the first dominant wavelength. In some embodiments, the second dominant wavelength may be at least about 15 nm different than the first dominant wavelength, and in some embodiments at least about 20 nm different than the first dominant wavelength.

In particular embodiments, the first red phosphor in the phosphor composition may have an emission spectrum with a dominant wavelength of about 630 nm, and the second red phosphor in the phosphor composition may have an emission spectrum with a dominant wavelength of about 650 nm.

In particular, the first red nitride phosphor may be configured to have an emission spectrum with a dominant wavelength of about 630 nm when excited by light having a wavelength less than about 455 nm. The first red nitride phosphor may have a composition of $(Ca_{1-x-y}Sr_xEu^{2+}{}_y)SiAlN_3$ (where x+y<1) with a europium content (y) of about 0.02 to 0.03, and may have a strontium content (x) of about 0.800 to about 0.92.

In some embodiments, the first (630 nm) $(Ca_{1-x-y}Sr_xEu^{2+}{}_y)SiAlN_3$ phosphor may have the following strontium, europium and calcium concentrations:

0.80≤Sr≤0.92
0.02≤Eu≤0.035
0.045≤Ca≤0.18.

In particular embodiments, the first $(Ca_{1-x-y}Sr_xEu^{2+}{}_y)SiAlN_3$ phosphor may have the strontium concentration of about 0.87, a europium concentration of about 0.025, and a calcium concentration of 0.105. These $(Ca_{1-x-y}Sr_xEu^{2+}{}_y)SiAlN_3$ phosphors may have a peak wavelength centered around about 630 nm.

The second red phosphor may be configured to have an emission spectrum with a dominant wavelength of about 650 nm when excited by light having a wavelength less than about 455 nm. The second red phosphor may have a composition of $(Ca_{1-x-y}Sr_xEu^{2+}{}_y)SiAlN_3$ with a europium content (y) of about 0.003 to about 0.015, and may have a strontium content (x) of about 0.15 to about 0.3.

In some embodiments, the second red phosphor may have a composition of $(Ca_{1-x-y}Sr_xEu^{2+}{}_y)SiAlN_3$ (where x+y<1) with the following strontium, europium and calcium concentrations:

0.15≤Sr≤0.3
0.005≤Eu≤0.010
0.69≤Ca≤0.847.

In particular embodiments, the second red phosphor may have a strontium concentration of about 0.20, a europium concentration of about 0.006, and a calcium concentration of 0.794. These $(Ca_{1-x-y}Sr_xEu^{2+}{}_y)SiAlN_3$ phosphors may have a peak wavelength centered around about 650 nm.

The green phosphor may be a $Lu_3Al_5O_{12}$:Ce phosphor ("LuAG:Ce phosphor"), $Y_aCe_bAl_cGa_dO_z$ phosphor ("gallium substituted YAG:Ce phosphor"), or a combination of a gallium substituted YAG:Ce phosphor and a LuAG:Ce phosphor.

The yellow phosphor may include a $Y_aCe_bAl_cO_z$ phosphor ("YAG:Ce phosphor").

The recipient luminophoric medium and the LED may be configured to together emit white light having a correlated color temperature between about 2500K and about 4500K and a CRI Ra of at least 85, at least 88, and in some embodiments at least 90.

The LED may emit light having a dominant wavelength that is less than 455 nm, in some embodiments between 450 nm and 455 nm, and in some embodiments about 452 nm to about 455 nm.

DETAILED DESCRIPTION

Solid state light emitting devices according to embodiments of the present invention may include III-V nitride (e.g., gallium nitride) based LEDs or lasers fabricated on a silicon carbide, sapphire or gallium nitride substrates such as those devices manufactured and/or sold by Cree, Inc. of Durham, N.C. Such LEDs and/or lasers may (or may not) be configured to operate such that light emission occurs through the substrate in a so-called "flip chip" orientation. Solid state light emitting devices according to embodiments of the present invention include both vertical devices with a cathode contact on one side of the chip, and an anode contact on an opposite side of the chip and devices in which both contacts are on the same side of the device.

Visible light may include light having many different wavelengths. The apparent color of visible light can be illustrated with reference to a two-dimensional chromaticity diagram, such as the 1931 CIE Chromaticity Diagram illustrated in FIG. 1. Chromaticity diagrams provide a useful reference for defining colors as weighted sums of colors.

Figure 1:
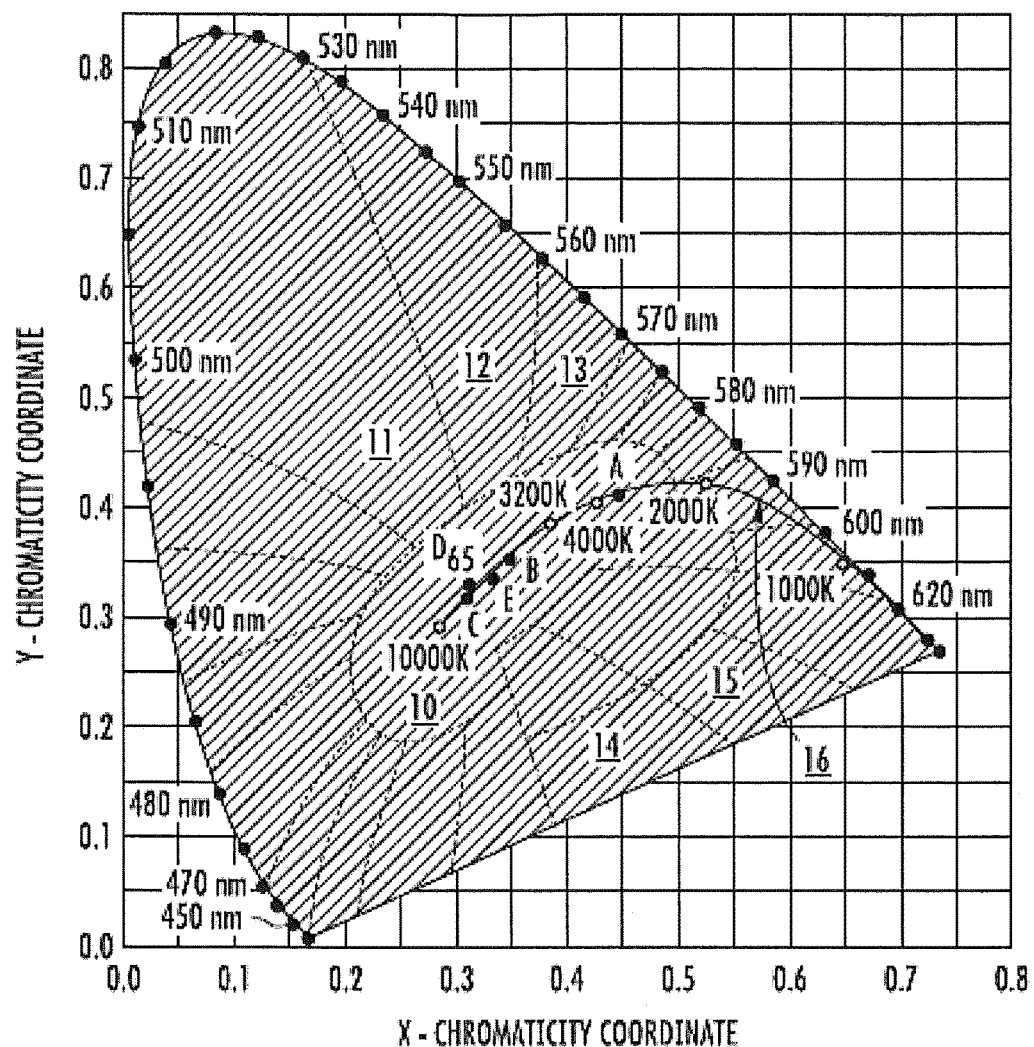
FIG. 1 is a graph of a 1931 CIE Chromaticity Diagram illustrating the location of the planckian locus.

As shown in FIG. 1, colors on a 1931 CIE Chromaticity Diagram are defined by x and y coordinates (i.e., chromaticity coordinates, or color points) that fall within a generally U-shaped area. Colors on or near the outside of the area are saturated colors composed of light having a single wavelength, or a very small wavelength distribution. Colors on the interior of the area are unsaturated colors that are composed of a mixture of different wavelengths. White light, which can be a mixture of many different wavelengths, is generally found near the middle of the diagram, in the region labeled 10 in FIG. 1. There are many different hues of light that may be considered "white," as evidenced by the size of the region 10. For example, some "white" light, such as light generated by sodium vapor lighting devices, may appear yellowish in color, while other "white" light, such as light generated by some fluorescent lighting devices, may appear more bluish in color.

Light that generally appears green or includes a substantial green component is plotted in the regions 11, 12 and 13 that are above the white region 10, while light below the white region 10 generally appears pink, purple or magenta. For example, light plotted in regions 14 and 15 of FIG. 1 generally appears magenta (i.e., red-purple or purplish red).

It is further known that a binary combination of light from two different light sources may appear to have a different color than either of the two constituent colors. The color of the combined light may depend on the wavelengths and relative intensities of the two light sources. For example, light emitted by a combination of a blue source and a red source may appear purple or magenta to an observer. Similarly, light emitted by a combination of a blue source and a yellow source may appear white to an observer.

Each point in the graph of FIG. 1 is referred to as the "color point" of a light source that emits a light having that color. As shown in FIG. 1 a locus of color points that is referred to as the "black-body" locus 16 exists which corresponds to the location of color points of light emitted by a black-body radiator that is heated to various temperatures. The black-body locus 16 is also referred to as the "planckian" locus because the chromaticity coordinates (i.e., color points) that lie along the black-body locus obey Planck's equation: $E(\lambda)=A\lambda^{-5}/(e^{B/T}-1)$, where E is the emission intensity, $\lambda$ is the emission wavelength, T is the color temperature of the black-body and A and B are constants. Color coordinates that lie on or near the black-body locus 16 may yield pleasing white light to a human observer.

As a heated object becomes incandescent, it first glows reddish, then yellowish, then white, and finally bluish. This occurs because the wavelength associated with the peak radiation of the black-body radiator becomes progressively shorter with increased temperature, consistent with the Wien Displacement Law. Illuminants that produce light which is on or near the black-body locus 16 can thus be described in terms of their correlated color temperature (CCT). As used herein, the term "white light" refers to light that is perceived as white, is within a 7-step MacAdam ellipse of the black-body locus on a 1931 CIE chromaticity diagram, and has a CCT ranging from 2000K to 10,000K. White light with a CCT of 4000K may appear yellowish in color, while white light with a CCT of 8000K or more may appear more bluish in color, and may be referred to as "cool" white light. "Warm" white light may be used to describe white light with a CCT of between about 2500K and 4500K, which is more reddish or yellowish in color. Warm white light is generally a pleasing color to a human observer. Warm white light with a CCT of 2500K to 3300K may be preferred for certain applications.

The ability of a light source to accurately reproduce color in illuminated objects is typically characterized using the color rendering index ("CRI Ra" or "CRI"). The CRI Ra of a light source is a modified average of the relative measurements of how the color rendition of an illumination system compares to that of a reference black-body radiator when illuminating eight reference colors that are referred to as R1 through R8. Thus, the CRI Ra is a relative measure of the shift in surface color of an object when lit by a particular lamp. The CRI Ra equals 100 if the color coordinates of a set of test colors being illuminated by the illumination system are the same as the coordinates of the same test colors being irradiated by the black-body radiator. Daylight generally has a CRI Ra of nearly 100, incandescent bulbs have a CRI Ra of about 95, fluorescent lighting typically has a CRI Ra of about 70 to 85, while monochromatic light sources have a CRI Ra of essentially zero. Light sources for general illumination applications with a CRI Ra of less than 50 are generally considered very poor and are typically only used in applications where economic issues preclude other alternatives. Light sources with a CRI Ra value between 70 and 80 have application for general illumination where the colors of objects are not important. For many general interior illumination applications, a CRI Ra value of greater than 80 is acceptable. A light source with color coordinates within a 4-step MacAdam ellipse of the black-body locus 4 and a CRI Ra value that exceeds 85 is more suitable for general illumination purposes. Light sources with CRI Ra values of more than 90 provide greater color quality and may be used, for example, in retail settings.

For backlight, general illumination and various other applications, it is often desirable to provide a lighting source that generates white light having a relatively high CRI Ra, so that objects illuminated by the lighting source may appear to have more natural coloring to the human eye. Accordingly, such lighting sources may typically include an array of solid state lighting devices including red, green and blue light emitting devices that generate a combined light that, may appear white, or nearly white, depending on the color points and relative intensities of the red, green and blue sources. However, even light that is a combination of red, green and blue emitters may have a low CRI Ra, particularly if the emitters generate saturated light, because such light may lack contributions from many visible wavelengths.

As noted above, CRI Ra is an average color rendering value for eight specific sample colors that are generally referred to as R1-R8. Additional sample colors R9-R15 are also often used in evaluating the color rendering properties of a light source. The sample color R9 is the saturated red color, and it is generally known that the ability to reproduce red colors well is key for accurately rendering colors, as the color red is often found mixed into processed colors. Accordingly, all else being equal, lamps with high R9 values tend to produce the most vivid colors.

Another important performance parameter for an LED lighting source is the intensity of the light emitted, which is referred to as the radiant flux of the device. However, as the human eye has varying sensitivity to different wavelengths of light, the intensity of the light emitted by a lighting source is most typically measured in terms of the lighting source's "luminous flux," which is a measure of the power of the light emitted by a light source as perceived by a human observer. The luminous flux of a light source is typically measured in lumens (lm). The luminous flux of a light source differs from the radiant flux of the light source in that the radiant flux measures the total power emitted, while the luminous flux weights the power of the light emitted at each wavelength based on a luminosity function which represents the response of the human eye for each different wavelength. The human eye has the greatest sensitivity to light that is at a wavelength of about 555 nm.

Because of the varying sensitivity of the human eye to light of different wavelengths, there tends to be a tradeoff between the intensity of the light emitted by an LED lighting source and the CRI of the light emitted. For example, since the human eye is most sensitive to light at a wavelength of about 555 nm, a monochromatic light source at 555 nm would exhibit a high luminous flux value. However, in order to obtain high CRI values, it is generally necessary to have light contribution across a wide range of wavelengths, including wavelengths that are relatively far away from 555 nm where the peak sensitivity of light to the human eye occurs. Because the human eye has reduced sensitivity to the wavelengths on either end of the visible light spectrum, the light contributions that are often added to improve the CRI of a device may result, in a decrease in the luminous flux of the device.

According to some embodiments of the present invention, LED-based light emitting devices are provided that may exhibit improved luminous flux values while maintaining good color rendering properties (e.g., a CRI Ra value of greater than 80). These light emitting devices may include luminophoric mediums that include at least three different types of luminescent materials. A "luminescent material" refers to a material such as a phosphor that absorbs light having first wavelengths and re-emits light having second wavelengths that are different from the first wavelengths, regardless of the delay between absorption and re-emission and regardless of the wavelengths involved. For example, "down-conversion" luminescent materials may absorb light having shorter wavelengths and re-emit light having longer wavelengths. Herein, the term "luminophoric medium" refers to a medium which includes one or more luminescent materials. A wide variety of luminescent materials are known, with exemplary materials being disclosed in, for example, U.S. Pat. No. 6,600,175 and U.S. Patent Application Publication No. 2009/0184616. In addition to phosphors, other luminescent materials include scintillators, day glow tapes, nanophosphors, quantum dots, fluorescent materials, phosphorescent materials and inks that glow in the visible spectrum upon illumination with (e.g., ultraviolet) light. Exemplary luminophoric mediums include layers that include luminescent materials that are coated on solid state light emitting devices or lenses thereof and clear encapsulants (e.g., epoxy-based or silicone-based curable resin) that include luminescent materials that are arranged to partially or fully cover one or more solid state light emitting devices.

In some embodiments, the light emitting devices may comprise a blue or ultraviolet LED that has a luminophoric medium that includes a green phosphor, a yellow phosphor, and a red phosphor. Herein a "green phosphor" refers to a phosphor that emits light having a peak wavelength in the green color range (when, for example, excited by the blue or ultraviolet LED light source), a "yellow phosphor" refers to a phosphor that emits light having a peak wavelength in the yellow color range, and a "red phosphor" refers to a phosphor that emits light having a peak wavelength in the red color range. In some embodiments, the green phosphor may comprise a $Lu_3Al_5O_{12}$ or a $Y_aCe_bAl_cGa_dO_z$ phosphor (referred to herein as a "gallium-substituted YAG:Ce" phosphor), the yellow phosphor may comprise a YAG:Ce phosphor and/or a nitride phosphor, and the red phosphor may comprise a $(Ca_{1-x-y}Sr_xEu^{2+}_y)SiAlN_3$ phosphor.

The color ranges of visible light are generally as shown in Table 1, below. It will be appreciated that these color ranges are approximate, and that there are not sharp boundaries between different colors of the spectrum. For example, light having wavelengths from 430-450 nm may appear blue-violet, while light having wavelengths from 550-570 nm may appear yellow-green, etc.

TABLE 1

Color Ranges of Visible Light

| Color | Wavelength Range |
| --- | --- |
| Violet | 380-430 nm |
| Blue | 430-495 nm |
| Green | 495-550 nm |
| Yellow | 550-590 nm |
| Orange | 590-620 nm |
| Red | 620-750 nm |

In some embodiments, a gallium-substituted YAG:Ce phosphor may be used as the green phosphor and have the chemical formula $Y_aCe_bAl_cGa_dO_z$, where:

$b/(a+b)=P$, and $0<P<0.1$;
$d/(c+d)=Q$, and $10<Q<0.6$;
$R=(a+b)/(c+d)$, and $0.5<R<0.7$; and
z is nominally 12.

In other embodiments, tighter ranges may be used such as, for example:

$0.2<P<0.5$;
$0.25<Q<0.5$; and
$0.55<R<0.6$

In still other embodiments, even tighter ranges may be used such as, for example:

$0.2<P<0.3$;
$0.4<Q<0.5$; and
$0.55<R<0.6$

Figure 2:
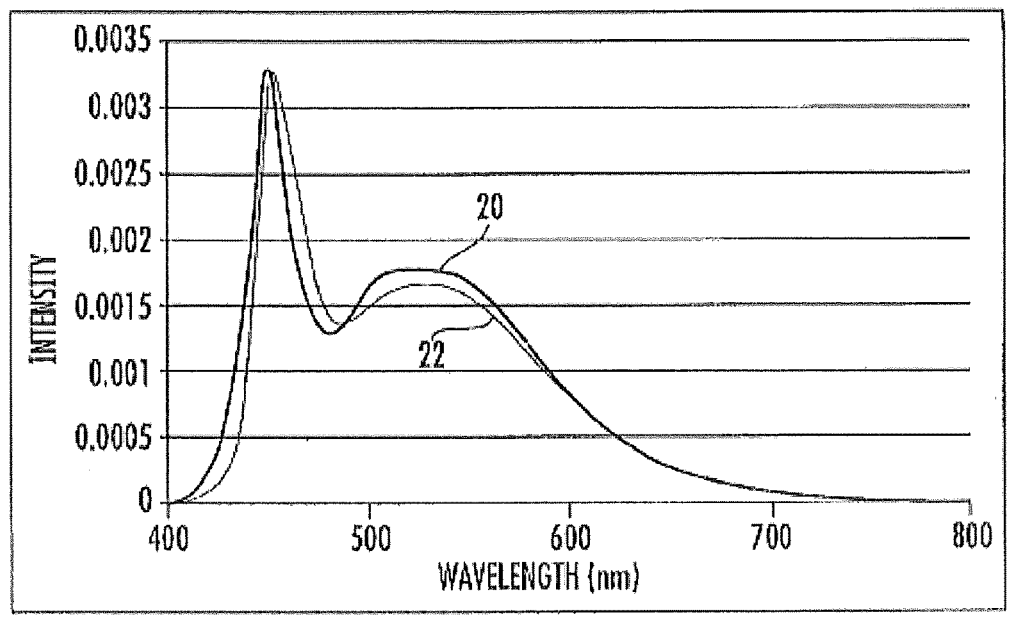
FIG. 2 is graph comparing the luminous flux of a light emitting device that includes a blue LED and an $Lu_3Al_5O_{12}$:Ce phosphor to a light emitting device that includes a comparable blue LED and a $Y_aCe_bAl_cGa_dO_z$ phosphor.

The gallium-substituted YAG:Ce phosphors that may be included in the luminophoric mediums of light emitting devices according to some embodiments of the present invention may also be more efficient at absorbing and down-converting blue light having shorter wavelengths as compared to other conventional phosphors such as, for example, a $Lu_3Al_5O_{12}$:Ce green phosphor (referred to as "LuAG:Ce" phosphor herein). In particular, FIG. 2 is a graph illustrating the luminous flux of first and second light emitting device that each comprise a blue LED that has a luminophoric medium with a green phosphor. In the first device (curve 20), the green phosphor comprises a conventional LuAG:Ce phosphor, while in the second device (curve 22) the green phosphor comprises the above-described gallium substituted YAG:Ce phosphor. In each case, the blue LED had the same peak wavelength. The blue LED in each device also had the same dominant wavelength.

As shown in FIG. 2, the peak emission in the blue color range of the first device (i.e., the device with the LuAG:Ce phosphor) is to the left of the peak emission in the blue color range of the second device that includes the above-described gallium substituted YAG:Ce phosphor, even though the blue LEDs in each device had the same dominant wavelength. This shows that the gallium substituted YAG:Ce phosphor is absorbing more light at the lower wavelengths in the blue color range as compared to the LuAG:Ce phosphor.

Figure 3:
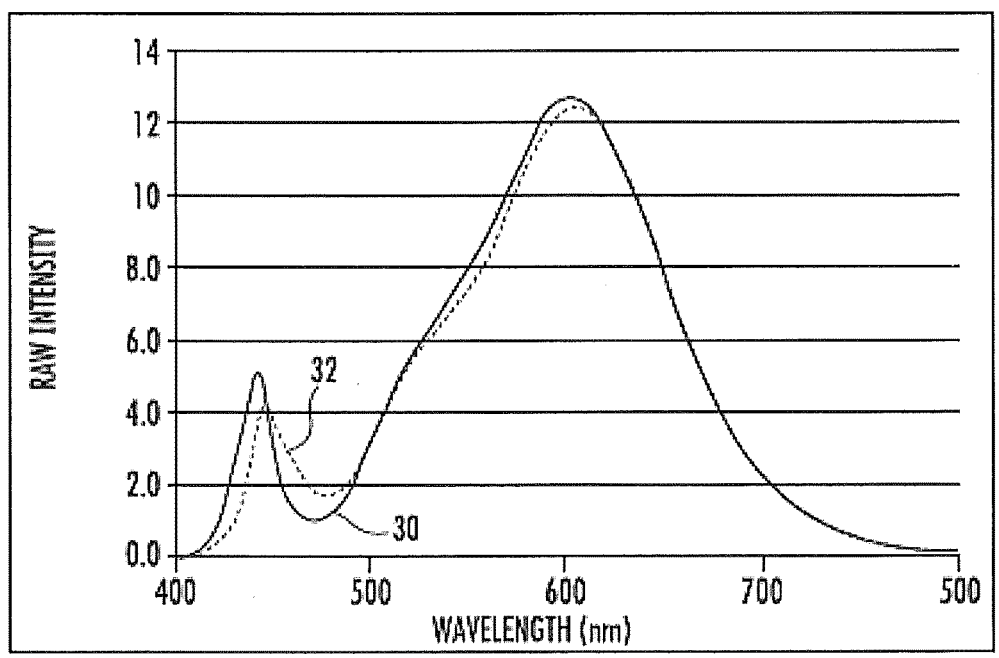
FIG. 3 is graph comparing the luminous flux of a light emitting device that includes a blue LED and a luminophoric medium that includes a YAG:Ce phosphor, an $Lu_3Al_5O_{12}$:Ce phosphor and a $(Ca_{1-x-y}Sr_xEu^{2+}{}_y)SiAlN_3$ phosphor to a light emitting device that includes a comparable blue LED and a luminophoric medium that includes a YAG:Ce phosphor, a $Y_aCe_bAl_cGa_dO_z$ phosphor and a $(Ca_{1-x-y}Sr_xEu^{2+}{}_y)SiAlN_3$.

FIG. 3 is a graph illustrating the luminous flux of first and second light emitting devices that each comprise a blue LED that has a luminophoric medium that includes all three of a green phosphor, a yellow phosphor and a red phosphor. In the first device (curve 30), the green phosphor comprises a conventional LuAG:Ce phosphor, while in the second device (curve 32) the green phosphor comprises the above-described gallium substituted YAG:Ce phosphor. The same yellow and red phosphors are used in each device, and in each case, the blue LED had the same peak wavelength and luminous flux As shown in curve 30, FIG. 3, the peak emission in the blue color range of the first device (i.e., the device with the LuAG:Ce phosphor) is once again to the left of the peak emission in the blue color range of the second device (curve 32) that includes the above-described gallium substituted YAG:Ce phosphor. This again shows that the gallium substituted YAG:Ce phosphor is absorbing more light at the lower wavelengths in the blue color range as compared to the LuAG:Ce phosphor. This also illustrates that the addition of the yellow and red phosphors does not impact the absorption characteristics of the gallium substituted YAG:Ce phosphor with respect to the light emitted by the blue LED. As is further shown in FIG. 3, the light emitting device that includes the gallium substituted YAG:Ce phosphor has a lower peak emission in the blue color range (peaking at a value of about 4) as compared to the light emitting device that includes the LuAG:Ce phosphor (which peaks at a value of about 5). Additionally, the light emitting device that includes the gallium substituted YAG:Ce phosphor has generally higher emission in the cyan and low wavelength green color ranges as compared to the light emitting device that includes the LuAG:Ce phosphor. This indicates that the gallium substituted YAG:Ce phosphor is down-converting a greater percentage of the light emitted by the blue LED. As shown in FIG. 3 this tends to smooth out the emission spectra in the lower wavelength ranges, which may generally tend to result in improved CRI Ra performance.

Figure 4:
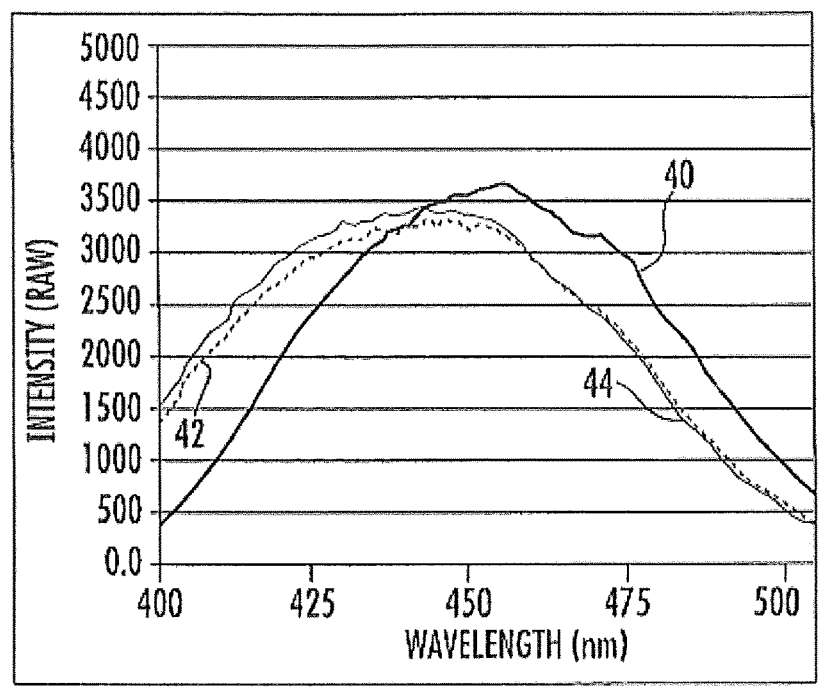
FIG. 4 is a graph illustrating the intensity of light emitted by various green phosphors as a function of the peak wavelength of the light used to excite the phosphors.

FIG. 4 is a graph illustrating the output of a fluorescence spectrometer that shows the intensity of light emitted at about 540 nm by a green phosphor as a function of the lower wavelength light that is used to excite the phosphor. In FIG. 4, the horizontal axis represents the peak wavelength of the light that the spectrometer emits that is used to excite the phosphor, while the vertical axis represents the relative intensity of the light emitted by the phosphor at about 540 nm. In FIG. 4, curve 40 shows the intensity the light emitted by a LuAG:Ce phosphor while curves 42 and 44 show the intensity the light emitted by two different gallium-substituted YAG:Ce phosphors. As shown in FIG. 4, the gallium-substituted YAG:Ce phosphors are more easily excited by blue light at shorter wavelengths as compared to the LuAG:Ce phosphor.

Because the gallium-substituted YAG:Ce phosphor absorbs more heavily in the lower blue wavelengths, the light emitting devices according to some embodiments of the present invention may include blue LEDs that have shorter dominant wavelengths such as, for example, dominant wavelengths in the range of about 440 nanometers to about 454 nanometers. This may have multiple advantages for some applications as (1) all else being equal blue LEDs having shorter dominant wavelengths tend to have, on average, higher radiant flux values than blue LEDs having longer dominant wavelengths (e.g., wavelengths in the range of about 460 nanometers to about 475 nanometers) and (2) blue LEDs having shorter dominant wavelengths tend to exhibit an improved hot/cold brightness ratio as compared to blue LEDs having longer dominant wavelengths. As known to those of skill in the art, the hot/cold brightness ratio refers to the brightness of the LED as measured at a high temperature (e.g., 85° C.) as compared to the brightness of the LED as measured at a lower temperature (e.g., 25° C.). Lower hot/cold brightness ratios are desired as they indicate that the LED operates more consistently as a function of operating temperature, which allows the device to provide more consistent color rendering.

The ratio (by weight) of the amount of LuAG:Ce or gallium-substituted YAG:Ce phosphor to the amount of YAG:Ce phosphor plus gallium-substituted YAG:Ce phosphor may be between 70% and 90% in some embodiments. In these embodiments, the ratio (by weight) of the amount of YAG:Ce phosphor and LuAG:Ce or gallium-substituted YAG:Ce phosphor to the combined amount of $(Ca_{1-x-y}Sr_xEu^{2+}{}_y)SiAlN_3$ red phosphor may be between about 3 to about 6 in some embodiments. Thus, in these embodiments:

70%<LuAG:Ce or gallium-substituted YAG:Ce/[YAG:Ce+LuAG:Ce or gallium-substituted YAG:Ce]<90%

3<[YAG:Ce+LuAG:Ce or gallium-substituted YAG:Ce]/$(Ca_{1-x-y}Sr_xEu^{2+}{}_y)SiAlN_3$<6

In other embodiments, the ratios of the amounts of phosphor (by weight) may be as follows:

75%<LuAG:Ce or gallium-substituted YAG:Ce/[YAG:Ce+LuAG:Ce or gallium-substituted YAG:Ce]<85%

3.5<[YAG:Ce+gallium-substituted YAG:Ce]/$(Ca_{1-x-y}Sr_xEu^{2+}{}_y)SiAlN_3$<5.5

In still other embodiments, the ratios of the amounts of phosphor (by weight) may be as follows:

77%<LuAG:Ce or gallium-substituted YAG:Ce/[YAG:Ce+LuAG:Ce or gallium-substituted YAG:Ce]<83%

3.75<[YAG:Ce+gallium-substituted YAG:Ce]/$(Ca_{1-x-y}Sr_xEu^{2+}{}_y)SiAlN_3$<4.75

Specific ratios may be selected that, for example, maximize the luminous flux of the light emitting device while maintaining a minimum desired CRI Ra value. The ratios will vary to an extent based on the dominant wavelength of the blue LED and the target color point.

Light emitting devices are known that comprise a blue LED and a luminophoric medium that includes a green phosphor, a yellow phosphor and a red phosphor (herein a "green/yellow/red phosphor light emitting device") and are disclosed, for example, in U.S. Patent Publication No. 2011-0220929. An example light emitting device uses a blue LED and produces a warm white light having a CRI of 80.1. In these light emitting devices, the green phosphor may be a LuAG:Ce phosphor, the yellow phosphor may be a YAG:Ce phosphor and/or a nitride phosphor and the red phosphor may be a $(Ca_{1-x-y}Sr_xEu^{2+}{}_y)SiAlN_3$ phosphor. Such light emitting devices may have phosphor ratios as follows:

LuAG/[YAG+LuAG]=70%

4.5<[YAG+LuAG]/$(Ca_{1-x-y}Sr_xEu^{2+}{}_y)SiAlN_3$<5.0

Embodiments of the present invention will now be described with reference to the drawings.

Figure 5:
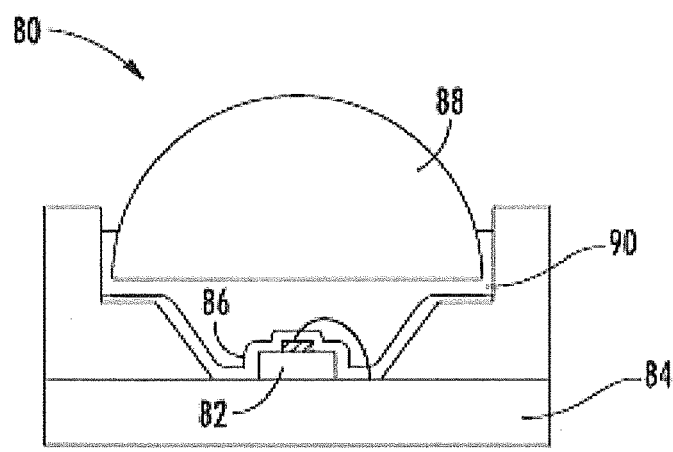
FIG. 5 is a schematic side view of a light emitting device according to certain embodiments of the present invention.

FIG. 5 is a side schematic view of a light emitting device 80 according to some embodiments of the present invention. As shown in FIG. 5, the light emitting device 80 includes an LED 82 that is mounted on a mounting surface 84. A luminophoric medium 86 is provided that is positioned to receive light that is emitted by the LED 82. In the embodiment pictured in FIG. 5, the luminophoric medium 86 is coated on an upper and side surfaces of the LED 82. It will be appreciated, however, that the luminophoric medium may be placed in other locations. For example, in other embodiments, the luminophoric medium 86 may be coated on an interior and/or exterior surface of a lens 88, embodied as an encapsulant material 90 that is provided between the LED 82 and the lens 88 or in any other suitable location where the luminophoric medium 86 may receive at least some of the light emitted by the LED 82 and convert at least some of the emitted light to light having different wavelengths.

The LED 82 may comprise, for example, an LED that emits radiation having a dominant wavelength in the blue color range (e.g., radiation with a dominant wavelength of 425 to 475 nanometers). In some embodiments, the LED may comprise a short wavelength blue LED that emits radiation having a dominant wavelength between about 440 nm and about 455 nm. The luminophoric medium 86 may comprise an encapsulant material such as, for example, silicone that has luminescent materials suspended therein.

Figure 6A:
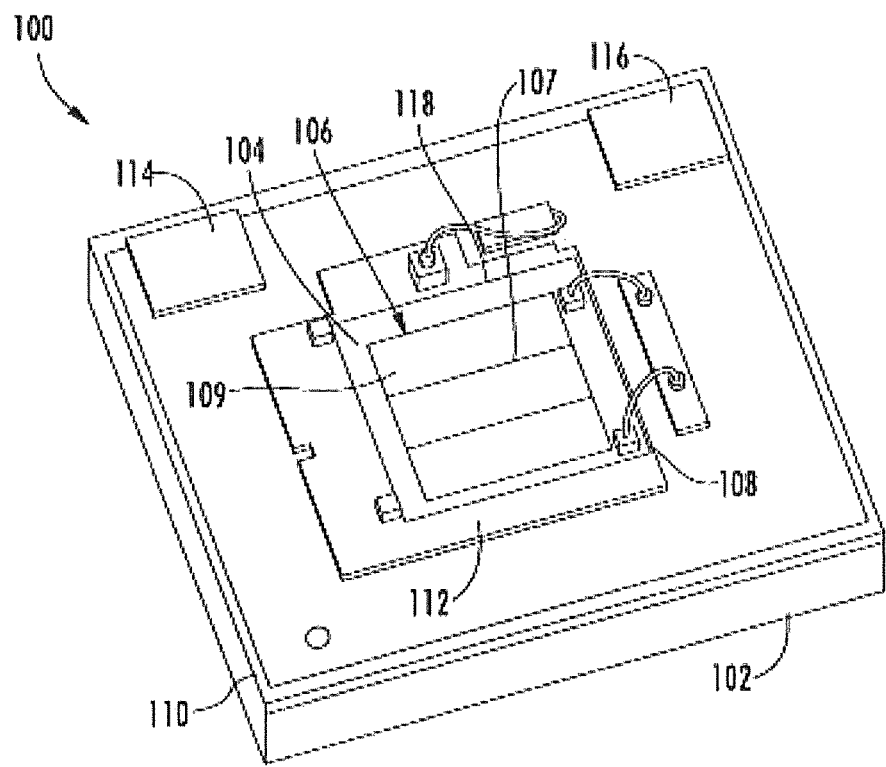
FIGS. 6A-6D are various views of a solid state light emitting device according to embodiments of the present invention.
Figure 6B:
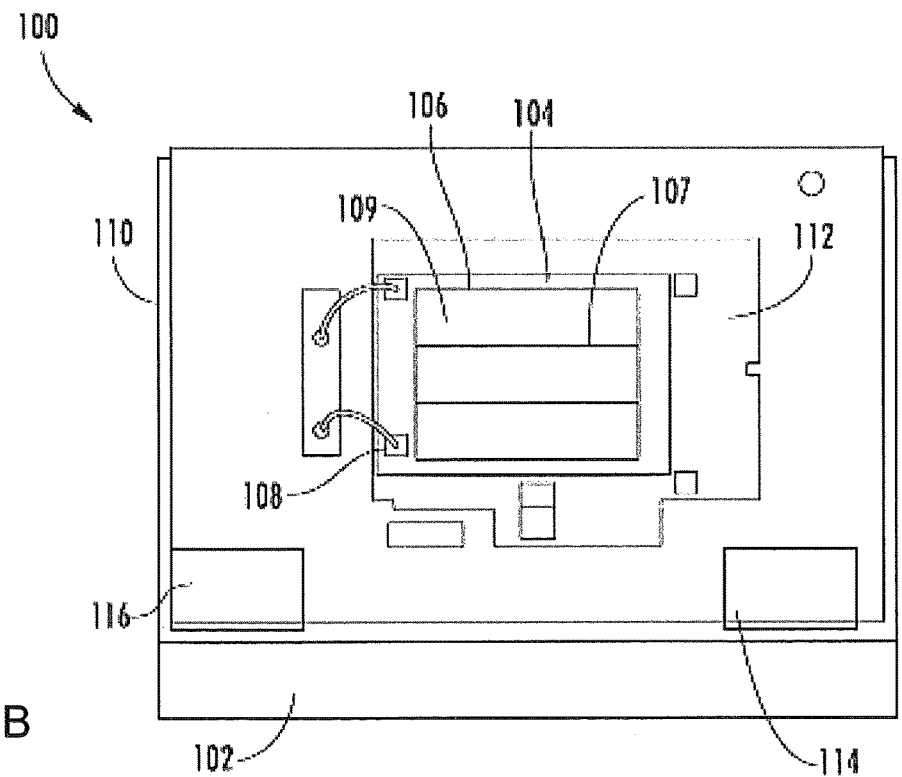
Figure 6C:
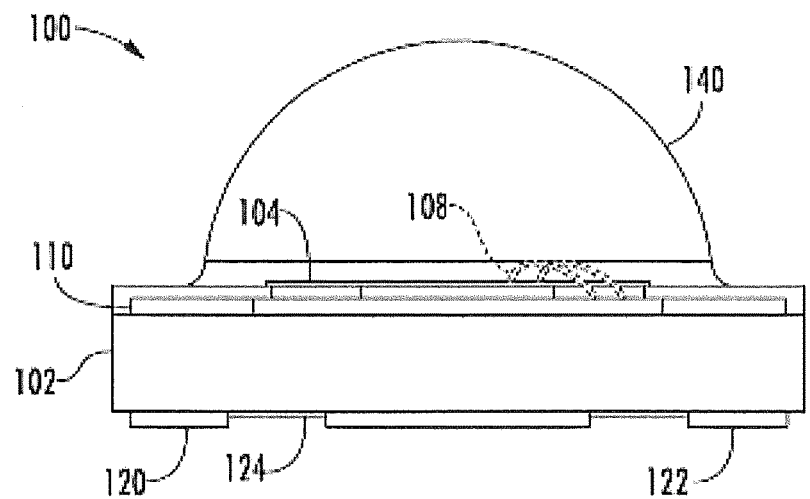
Figure 6D:
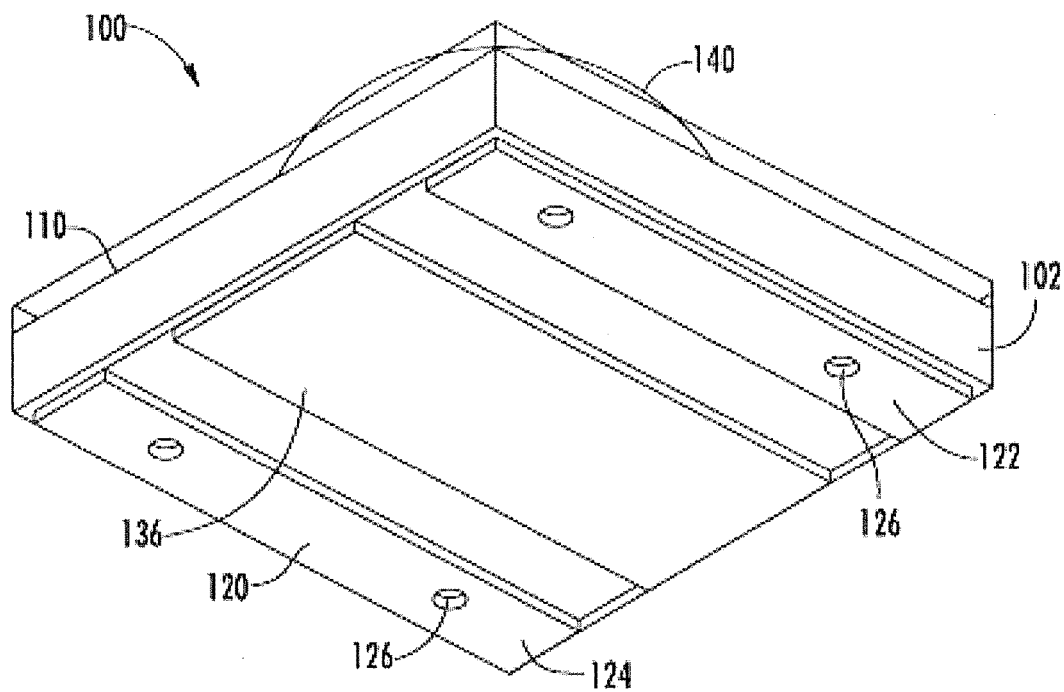

A solid state light emitting device 100 will now be described that includes a luminophoric medium according to embodiments of the present invention with reference to FIGS. 6A-6D. The solid state light emitting device 100 comprises a packaged LED. In particular, FIG. 6A is a perspective view of the solid state light emitting device 100 without a lens thereon. FIG. 6B is a perspective view of the device 100 viewed from the opposite side. FIG. 6C is a side view of the device 100 with a lens covering the LED chip. FIG. 6D is a bottom perspective view of the device 100.

As shown in FIG. 6A, the solid state light emitting device 100 includes a substrate/submount ("submount") 102 on which a single LED chip or "die" 104 is mounted. The submount 102 can be formed of many different materials such as, for example, aluminum oxide, aluminum nitride, organic insulators, a printed circuit board (PCB), sapphire or silicon. The LED 104 can have many different semiconductor layers arranged in different ways. LED structures and their fabrication and operation are generally known in the art and hence are only briefly discussed herein. The layers of the LED 104 can be fabricated using known processes such as, for example, metal organic chemical vapor deposition (MOCVD). The layers of the LED 104 may include at least one active layer/region sandwiched between first and second oppositely doped epitaxial layers all of which are formed successively on a growth substrate. Typically, many LEDs are grown on a growth substrate such as, for example, a sapphire, silicon carbide, aluminum nitride (AlN), or gallium nitride (GaN) substrate to provide a grown semiconductor wafer, and this wafer may then be singulated into individual LED dies, which are mounted in a package to provide individual packaged LEDs. The growth substrate can remain as part of the final singulated LED or, alternatively, the growth substrate can be fully or partially removed. In embodiments where the growth substrate remains, it can be shaped and/or textured to enhance light extraction.

It is also understood that additional layers and elements can also be included in the LED 104, including but not limited to buffer, nucleation, contact and current spreading layers as well as light extraction layers and elements. It is also understood that the oppositely doped layers can comprise multiple layers and sub-layers, as well as super lattice structures and interlayers. The active region can comprise, for example, a single quantum well (SQW), multiple quantum well (MQW), double heterostructure and/or super lattice structure. The active region and doped layers may be fabricated from different material systems, including, for example, Group-III nitride based material systems such as GaN, aluminum gallium nitride (AlGaN), indium gallium nitride (InGaN) and/or aluminum indium gallium nitride (AlInGaN). In some embodiments, the doped layers are GaN and/or AlGaN layers, and the active region is an InGaN layer.

The LED 104 may be an ultraviolet, violet or blue LED that emits radiation with a dominant wavelength in a range of about 380 nm to about 475 nm. As noted above, in some embodiments, a short wavelength blue LED having a peak wavelength between 440 nm and 460 nm may be used.

The LED 104 may include a conductive current spreading structure 106 on its top surface, as well as one or more contacts 108 that are accessible at its top surface for wire bonding. The spreading structure 106 and contacts 108 can both be made of a conductive material such as Au, Cu, Ni, In, Al, Ag or combinations thereof, conducting oxides and transparent conducting oxides. The current spreading structure 106 may comprise conductive fingers 107 that are arranged in a pattern on the LED 104 with the fingers spaced to enhance current spreading from the contacts 108 into the top surface of the LED 104. In operation, an electrical signal is applied to the contacts 108 through a wire bond as described below, and the electrical signal spreads through the fingers 107 of the current spreading structure 106 into the LED 104. Current spreading structures are often used in LEDs where the top surface is p-type, but can also be used for n-type materials.

The LED 104 may be coated with a luminophoric medium 109 according to embodiments of the present invention. As discussed above, this recipient luminophoric medium 109 may include particles of a green phosphor, particles of a yellow phosphor and particles of single or multiple red phosphors mixed therein (together and/or in separate layers). It will be understood that the recipient luminophoric medium 109 may comprise any of the recipient luminophoric mediums discussed in the present disclosure.

The recipient luminophoric medium 109 may include a binder material, and may have different concentrations or loading of phosphor materials in the binder, with a typical concentration being in range of 40-80% by weight. In one embodiment, the phosphor concentration is approximately 75% by weight, and may be generally uniformly dispersed throughout the binder. In other embodiments the recipient luminophoric medium 109 can comprise multiple layers of different concentrations or types of phosphors, and the multiple layers can comprise different binder materials. One or more of the layers can be provided without phosphors. For example, a first coat of clear silicone can be deposited followed by phosphor loaded layers. As another example, the coating may comprise, for example, a three layer coating that includes a first layer having a first phosphor that is coated directly on the LED chips 210, a second layer having a second phosphor that is coated directly on the first layer, and a third layer having a third phosphor that is coated directly on the second phosphor. Numerous other layer structures are possible, including multi-layers that include multiple phosphors in the same layer. Intervening layers or elements could also be provided between layers and/or between the coating and the underlying LED chips 104.

The recipient luminophoric medium 109 may be coated on the LED 104 using many different methods, with suitable methods being described in U.S. Patent Publication Nos. 2008-0173884 and 2008-0179611, both entitled Wafer Level Phosphor Coating Method and Devices Fabricated Utilizing Method. Alternatively the recipient luminophoric medium 109 may be coated on the LED 104 using other methods such an electrophoretic deposition (EPD), with a suitable EPD method described in U.S. Patent Publication No. 2007-0158668 entitled Close Loop Electrophoretic Deposition of Semiconductor Devices.

An optical element or lens 140 (see FIGS. 8C-8D) is formed on the top surface 110 of the submount 102, over the LED 104, to provide both environmental and/or mechanical protection. The lens 140 can be molded using different molding techniques such as those described in U.S. Patent Publication No. 2009-0108281 entitled Light Emitting Diode Package and Method for Fabricating Same. The lens 140 can be many different shapes such as, for example, hemispheric. Many different materials can be used for the lens 140 such as silicones, plastics, epoxies or glass. The lens 140 can also be textured to improve light extraction. In some embodiments, the lens 140 may comprise the recipient luminophoric medium 109 and/or may be used to hold a luminophoric medium 109 in place over the LED 104 instead of and/or in addition to coating a luminophoric medium 109 directly onto the LED chip 104.

The top surface 110 of the submount 102 may have patterned conductive features that can include a die attach pad 112 with an integral first contact pad 114. A second contact pad 116 is also included on the top surface 110 of the submount 102 with the LED 104 mounted approximately at the center of the attach pad 112. The attach pad 112 and first and second contact pads 114, 116 may comprise metals or other conductive materials such as, for example, copper. The copper pads 112, 114, 116 may be plated onto a copper seed layer that is, in turn, formed on a titanium adhesion layer. The pads 112, 114, 116 may be patterned using standard lithographic processes. These patterned conductive features provide conductive paths for electrical connection to the LED 104 using known contacting methods. The LED 104 can be mounted to the attach pad 112 using known methods and materials.

A gap 118 (see FIG. 6A) is included between the second contact pad 116 and the attach pad 112 down to the surface of the submount 102. An electrical signal is applied to the LED 104 through the second pad 116 and the first pad 114, with the electrical signal on the first pad 114 passing directly to the LED 104 through the attach pad 102 and the signal from the second pad 116 passing into the LED 104 through wire bonds. The gap 118 provides electrical isolation between the second pad 116 and attach pad 112 to prevent shorting of the signal applied to the LED 104.

Referring to FIGS. 6C and 6D, an electrical signal can be applied to the package 100 by providing external electrical contact to the first and second contact pads 114, 116 via first and second surface mount pads 120, 122 that are formed on the back surface 124 of the submount 102 to be at least partially in alignment with the first and second contact pads 114, 116, respectfully. Electrically conductive vias 126 are formed through the submount 102 between the first mounting pad 120 and the first contact pad 114, such that a signal that is applied to the first mounting pad 120 is conducted to first contact pad 114. Similarly, conductive vias 126 are formed between the second mounting pad 122 and second contact pad 116 to conduct an electrical signal between the two. The first and second mounting pads 120, 122 allow for surface mounting of the LED package 100 with the electrical signal to be applied to the LED 104 applied across the first and second mounting pads 120, 122.

The pads 112, 114, 116 provide extending thermally conductive paths to conduct heat away from the LED 104. The attach pad 112 covers more of the surface of the submount 102 than the LED 104, with the attach pad extending from the edges of the LED 104 toward the edges of the submount 102. The contact pads 114, 116 also cover the surface of the submount 102 between the vias 126 and the edges of the submount 102. By extending the pads 112, 114, 116, the heat spreading from the LED 104 may be improved, which may improve the operating life of the LED and/or allow for higher operating power.

The LED package 100 further comprises a metalized area 136 on the back surface 124 of the submount 102, between the first and second mounting pads 120, 122. The metalized area 136 may be made of a heat conductive material and may be in at least partial vertical alignment with the LED 104. In some embodiments, the metalized area 136 is not in electrical contact with the elements on top surface of the submount 102 or the first and second mounting pads 120, 122 on the back surface of the submount 102. Although heat from the LED 104 is spread over the top surface 110 of the submount 102 by the attach pad 122 and the pads 114, 116, more heat will pass into the submount 102 directly below and around the LED 104. The metalized area 136 can assist with this dissipation by allowing this heat to spread into the metalized area 136 where it can dissipate more readily. The heat can also conduct from the top surface 110 of the submount 10, through the vias 126, where the heat can spread into the first and second mounting pads 120, 122 where it can also dissipate.

According to still further embodiments, the brightness of light emitting devices may be further increased while maintaining a high (>88) CRI Ra by utilizing a four-phosphor system including at least two red phosphors having different emission wavelengths in combination with a yellow phosphor and a green phosphor as described above.

In some embodiments, a first red phosphor in the phosphor composition may have an emission spectrum with a first dominant wavelength, and a second red phosphor in the phosphor composition may have an emission spectrum with a second dominant wavelength that is at least about 10 nm different than the first dominant wavelength. In some embodiments, the second dominant wavelength may be at least about 15 nm different than the first dominant wavelength, in some embodiments at least about 20 nm different than the first dominant wavelength, and in some embodiments between 20 nm and 40 nm different than the first dominant wavelength.

To accomplish this, the first and second red phosphors may have different material compositions.

In particular embodiments, the first red phosphor in the phosphor composition may have an emission spectrum with a dominant wavelength of 620-640 nm, and the second red phosphor in the phosphor composition may have an emission spectrum with a dominant wavelength of 640-660 nm.

Providing a second red phosphor with a different composition and/or a different dominant wavelength than the first red phosphor may enable the use of an LED having a shorter dominant wavelength, which may improve efficiency while maintaining a similar CRI Ra. For example, instead of using an LED chip with a dominant wavelength of 460 nm or more as the primary light source, it may instead be possible to use an LED chip with a dominant wavelength of less than 460 nm as the primary light source of the device, and in some cases less than 455 nm. In some embodiments, the LED chip may have a dominant wavelength of about 450-455 nm, in some cases about 452-455 nm, and in some cases about 455-460. Such a device may surprisingly exhibit increased brightness while maintaining a CRI Ra greater than about 88, and in some cases greater than 90.

The first and second red phosphors may both comprise $(Ca_{1-x-y}Sr_xEu^{2+}{}_y)SiAlN_3$ phosphors having relative amounts of strontium and europium that are selected to provide a desired dominant emission wavelength when excited by primary light having a dominant wavelength less than about 455 nm.

In particular, the first red nitride phosphor may have a first material composition that is configured to have an emission spectrum with a dominant wavelength of about 630 nm when excited by light having a wavelength less than about 455 nm. The first red nitride phosphor may have a composition of $(Ca_{1-x-y}Sr_xEu^{2+}_y)SiAlN_3$ with a europium content of about 0.02 to 0.03, and may have a strontium content of about 0.800 to about 0.92.

In some embodiments, the first (630 nm) $(Ca_{1-x-y}Sr_xEu^{2+}_y)SiAlN_3$ phosphor may have the following strontium, europium and calcium concentrations:

$0.80 \le Sr \le 0.92$
$0.02 \le Eu \le 0.035$
$0.045 \le Ca \le 0.18$

In particular embodiments, the first $(Ca_{1-x-y}Sr_xEu^{2+}_y)SiAlN_3$ phosphor may have a strontium concentration of about 0.87, a europium concentration of about 0.025, and a calcium concentration of 0.105. These $(Ca_{1-x-y}Sr_xEu^{2+}_y)SiAlN_3$ phosphors may have a peak wavelength centered around about 630 nm.

The second red nitride phosphor may have a second material composition that is configured to have an emission spectrum with a dominant wavelength of about 650 nm when excited by light having a wavelength less than about 455 nm. The first red nitride phosphor may have a composition of $(Ca_{1-x-y}Sr_xEu^{2+}_y)SiAlN_3$ with a europium content of about 0.003 to 0.015, and may have a strontium content of about 0.15 to about 0.3.

In some embodiments, the second (650 nm) $(Ca_{1-x-y}Sr_xEu^{2+}_y)SiAlN_3$ phosphor may have the following strontium, europium and calcium concentrations:

$0.15 \le Sr \le 0.3$
$0.005 \le Eu \le 0.010$
$0.69 \le Ca \le 0.847$.

In particular embodiments, the second $(Ca_{1-x-y}Sr_xEu^{2+}_y)SiAlN_3$ phosphor may have the a strontium concentration of about 0.20, a europium concentration of about 0.006, and a calcium concentration of 0.794. These $(Ca_{1-x-y}Sr_xEu^{2+}_y)SiAlN_3$ phosphors may have a peak wavelength centered around about 650 nm.

Figure 7:
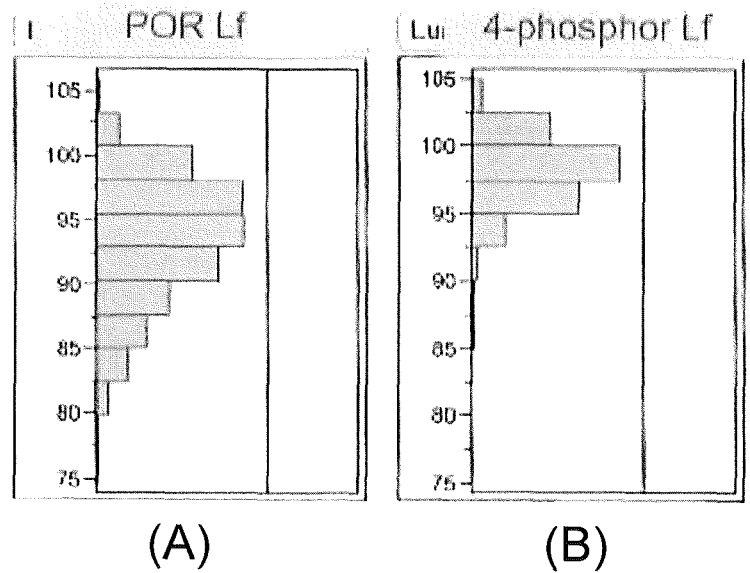
FIGS. 7-8 are charts that illustrate luminous flux and color rendering index that can be obtained with devices using phosphor combinations according to still further embodiments.
Figure 8:
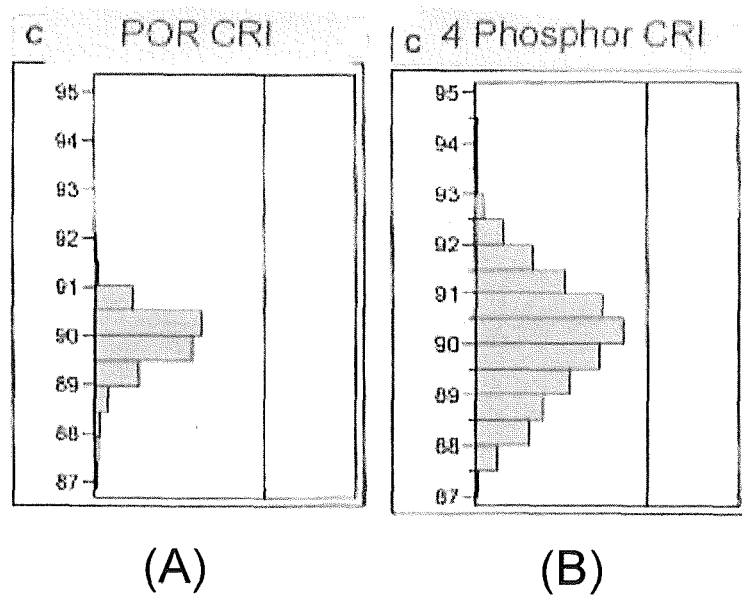

FIGS. 7 and 8 are charts that illustrate luminous flux and color rendering index that can be obtained with devices using phosphor combinations according to still further embodiments as compared with devices that use a three-phosphor composition.

For example, FIG. 7(A) illustrates an exemplary distribution of luminous flux (Lf) for devices with three-phosphor (red, yellow and green) phosphor compositions with a 460 nm primary emission wavelength, while FIG. 7(B) illustrates an exemplary distribution of luminous flux (Lf) for devices with four-phosphor (red, red, yellow and green) phosphor compositions with primary emission wavelengths of 452-455 nm.

As can be seen from FIGS. 7(A) and 7(B), the average luminous flux is significantly higher for the four-phosphor devices than for the three-phosphor devices. In fact, the median luminous flux for the four-phosphor devices is 98.25, compared with 93.5 for the three-phosphor devices. This represents an increase in brightness of about 5% for the four-phosphor devices relative to the three-phosphor devices.

FIG. 8(A) illustrates an exemplary distribution of CRI Ra for devices with three-phosphor (red, yellow and green) phosphor compositions with a 460 nm primary emission wavelength, while FIG. 8(B) illustrates an exemplary distribution of CRI Ra for devices with four-phosphor (red, red, yellow and green) phosphor compositions with primary emission wavelengths of 452-455 nm.

As can be seen in FIGS. 8(A) and 8(B), the average CRI Ra for the four-phosphor devices is about the same as that of the three-phosphor devices, although the distribution is somewhat wider for the four-phosphor devices. The median CRI Ra for the four-phosphor devices is slightly higher (+0.6 units) than the three-phosphor devices, however.

Figure 9:
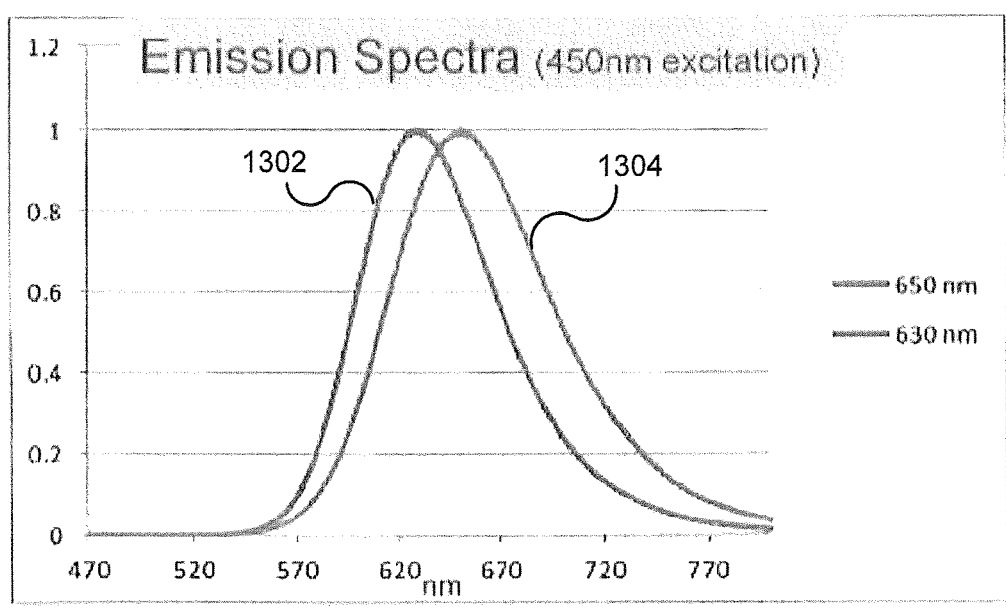
FIG. 9 is a graph illustrating emission spectra for phosphors used in devices according to still further embodiments.

FIG. 9 is a graph illustrating emission spectra for phosphors used in devices with an excitation wavelength of about 450 nm according to still further embodiments. In FIG. 9, curve 1302 is a graph of the emission spectrum for the first (630 nm) red nitride phosphor, while curve 1304 is a graph of the emission spectrum for the second (650 nm) red nitride phosphor.

Phosphors according to some embodiments may be utilized in many different types of devices and/or packages in addition to those described above. For example, phosphors according to some embodiments may be utilized in the devices and/or packages described in U.S. Publication No. 2012/0193649, entitled Light Emitting Diode (LED) Arrays Including Direct Die Attach And Related Assemblies, the disclosure of which is incorporated herein by reference in its entirety.

It is understood that although the present invention has been described with respect to LEDs having vertical geometries, it may also be applied to LEDs having other geometries such as, for example, to lateral LEDs that have both contacts on the same side of the LED chip.

In certain embodiments that are described above, the phosphor is shown as coated on the LED chips, for example in a silicone or other matrix material. It will be appreciated, however, that in other embodiments, the phosphor can be placed in and/or on an encapsulant and/or optic of the LED, such as silicone, epoxy or glass. The multiple phosphors can be mixed together in the matrix and/or positioned separately (in a remote phosphor configuration) on the optic and/or in discrete layers on the LED chip. In some embodiments, different colored LEDs or different LED chip or chips can be utilized.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

While embodiments of the present invention have primarily been discussed above with respect to solid state light emitting devices that include LEDs, it will be appreciated that according to further embodiments of the present invention, laser diodes and/or other solid state lighting devices may be provided that include the recipient luminophoric mediums discussed above. Thus, it will be appreciated that embodiments of the present invention are not limited to LEDs, but may include other solid state lighting devices such as laser diodes.

While specific phosphor combinations have been described above, it will be appreciated that other phosphor combinations may be used in alternative embodiments. By way of example, in other embodiments, the gallium substituted YAG:Ce phosphors could be replaced with a LuAG:Ce phosphor and vice-versa. Similarly, the YAG:Ce phosphor could be replaced with a yellow-light emitting nitride based phosphor. Thus, it will be appreciated that embodiments of the present invention are not limited to the specific examples described in the specification, but instead cover all embodiments that are within the scope of the appended claims.

The present invention has been described with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. The singular forms "a", "an" and "the" are intended to include the plural forms as well, unless the context clearly indicates otherwise. It will be further understood that, when used in this specification, the terms "comprises" and/or "including" and derivatives thereof, specify the presence of stated features, operations, elements, and/or components, but do not preclude the presence or addition of one or more other features, operations, elements, components, and/or groups thereof.

It will be understood that, although the terms first, second, etc. may be used herein to describe various elements, components, regions and/or layers, these elements, components, regions and/or layers should not be limited by these terms. These terms are only used to distinguish one element, component, region or layer from another element, component, region or layer. Thus, a first element, component, region or layer discussed below could be termed a second element, component, region or layer without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure.

The expression "light emitting device," as used herein, is not limited, except that it be a device that is capable of emitting light.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments and, although specific terms are employed, they are used in a generic and descriptive sense only and not for purposes of limitation, the scope of the inventive concepts being set forth in the following claims.

What is claimed is:

1. A light emitting device, comprising:
   a light emitting diode chip ("LED") that emits light having a dominant wavelength in a blue color range; and
   a recipient luminophoric medium that is configure to down-convert at least some of the light emitted by the LED, wherein the recipient luminophoric medium comprises:
      a green phosphor that down-converts the radiation emitted by the LED to radiation having a dominant wavelength that is between about 525 nanometers and about 550 nanometers;
      a yellow phosphor that down-converts the radiation emitted by the LED to radiation having a dominant wavelength that is between about 550 nanometers and about 580 nanometers;
      a first red phosphor that down-converts the radiation emitted by the LED to radiation haying a first dominant wavelength; and
      a second red phosphor that down-converts the radiation emitted by the LED to radiation having a second dominant wavelength that is different from the first dominant wavelength;
      wherein the first red phosphor and the second red phosphor each comprise strontium, europium, and calcium;
      wherein a first concentration of strontium in the first red phosphor is in a first strontium concentration range and a second concentration of strontium in the second red phosphor is in a second strontium concentration range;
      wherein a first concentration of europium in the first red phosphor is in a first europium concentration range and a second concentration of europium in the second red phosphor is in a second europium concentration range;
      wherein a first concentration of calcium in the first red phosphor is in a first calcium concentration range and a second concentration of calcium in the second red phosphor is in a second calcium concentration range; and
      wherein the first strontium concentration range and the second strontium concentration range do not overlap, the first europium concentration range and the second europium concentration range do not overlap, and the first calcium concentration range and the second calcium concentration range do not overlap.

2. The light emitting device of claim 1, wherein the second dominant wavelength of the second red phosphor is at least about 10 nm different than the first dominant wavelength of the first red phosphor.

3. The light emitting device of claim 2, wherein the second dominant wavelength of the second red phosphor is at least about 15 nm different than the first dominant wavelength of the first red phosphor.

4. The light emitting device of claim 2, wherein e second dominant wavelength of the second red phosphor is at least about 20 nm different than the first dominant wavelength of the first red phosphor.

5. The light emitting device of claim 1, wherein the first dominant wavelength of the first red phosphor is about 630 nm, and the second dominant wavelength of the second red phosphor is about 650 nm.

6. The light emitting device of claim 1, wherein the first red phosphor has an emission spectrum with a dominant wavelength of about 630 nm when excited by light having a wavelength less than about 455 nm.

7. The light emitting device of claim 1, wherein the first red phosphor has a composition of $(Ca_{1-x-y}Sr_xEu^{2+}{}_y)SiAlN_3$, where x+y<1, wherein the first europium concentration range is about 0.02 to about 0.035, and wherein the first strontium concentration range is about 0.800 to about 0.92.

8. The light emitting device of claim 7, wherein the first calcium concentration range is about 0.045 to about 0.18.

9. The light emitting device of claim 8, wherein the first concentration of strontium is about 0.87, the first concentration of europium is about 0.025, and a the first concentration of calcium is about 0.105.

10. The light, emitting device of claim 1, wherein the second red phosphor has an, emission spectrum with a dominant wavelength of about 650 nm when excited by light having a wavelength less than about 455 nm.

11. The light emitting device of claim 10, wherein the second red phosphor has a composition of $(Ca_{1-x-y}Sr_x Eu^{2+}{}_y)SiAlN_3$, where x+y<1, wherein the second europium concentration range is about 0.003 to about 0.015, and wherein the second strontium concentration range is about 0.15 to about 0.3.

12. The light emitting device of claim 11, wherein the second calcium concentration range is about 0.69 to about 0,847.

13. The light emitting device of claim 10, wherein the second red phosphor has a composition of $(Ca_{1-x-y}Sr_x Eu^{2+}{}_y)SiAlN_3$, where x+y<1, wherein the second concentration of strontium is about 0.20, wherein the second concentration of europium is about 0.006, and wherein the second concentration of calcium is about 0.794.

14. The light emitting device of claim 1, wherein the green phosphor comprises a LuAG:Ce phosphor phosphor, a gallium-substituted YAG:Ce phosphor, or a combination of a LuAG:Ce phosphor and a gallium-substituted YAG:Ce phosphor phosphor.

15. The light emitting device of claim 1, wherein the yellow phosphor comprises a YAG:Ce phosphor.

16. The light emitting device of claim 1, wherein the recipient luminophoric medium and the LED are together configured to emit white light having a correlated color temperature between about 2500K. and about 4500K.

17. The light emitting device of claim 1, wherein the recipient luminophoric medium and the LED are together configured to emit white light having a CRI Ra of at least 88.

18. The light emitting device of claim 1, wherein the recipient luminophoric medium and the LED are together configured to emit white light having a CRI Ra of at least 90.

19. The light emitting device of claim 1, wherein the recipient luminophoric medium and the LED are together configured to emit white light having a CRI Ra of at least 92.

20. The light emitting device of claim 1, wherein the light emitting diode emits light having a dominant wavelength that is less than about 455 nm.

21. The light emitting device of claim 1, wherein the light emitting diode emits light having a dominant wavelength that is less than about 460 nm.

22. The light emitting device of claim 1, wherein the light emitting diode emits light having a dominant wavelength that is between about 450 nm and about 455 nm.

23. The light emitting device of claim 1, wherein the light emitting diode emits light having a dominant wavelength that is between about 452 nm to about 455 nm.

24. The light emitting device of claim 1, wherein the recipient luminophoric medium and the LED are together configured to emit white light having a CRI Ra of at least 85.

25. A light emitting device, comprising:
   a light emitting diode chip ("LED") that emits light having a dominant, wavelength in the blue color range; and
   a recipient luminophoric medium that is configured to down-convert at least some of the light emitted by the LED, wherein the recipient luminophoric medium comprises a green phosphor, a yellow phosphor, a first red phosphor having a first composition and a second red phosphor having a second composition that is different from the first composition;
   wherein the first red phosphor and the second red phosphor each comprise strontium, europium, and calcium;
   wherein the first red phosphor is configured to down-convert the light emitted by the LED to radiation having a first dominant wavelength and the second red phosphor is configured to down-convert the light emitted by the LED to radiation having a second dominant wavelength that is different from the first dominant wavelength;
   wherein a first concentration of strontium in the first red phosphor is in a first strontium concentration range and a second concentration of strontium in the second red phosphor is in a second strontium concentration range;
   wherein a first concentration of europium in the first red phosphor is in a first europium concentration range and a second concentration of europium in the second red phosphor is in a second europium concentration range:
   wherein a first concentration of calcium in the first red phosphor is in a first calcium concentration range and second concentration of calcium in the second red phosphor is in a second calcium concentration range; and
   wherein the first strontium concentration range and the second strontium concentration range do not overlap, the first europium concentration range and the second europium concentration range do not overlap, and the first calcium concentration range and the second calcium concentration range do not overlap.

* * * * *

UNITED STATES PATENT AND TRADEMARK OFFICE
CERTIFICATE OF CORRECTION

PATENT NO. : 10,074,781 B2
APPLICATION NO. : 14/471697
DATED : September 11, 2018
INVENTOR(S) : Wilcox et al.

Page 1 of 1

It is certified that error appears in the above-identified patent and that said Letters Patent is hereby corrected as shown below:

In the Claims

Column 18, Line 58, Claim 4:
Please correct "wherein e second" to read -- wherein the second --

Column 19, Line 14, Claim 9:
Please correct "and a the" to read -- and the --

Column 19, Line 17, Claim 10:
Please correct "an, emission" to read -- an emission --

Column 19, Line 28, Claim 12:
Please correct "0,847" to read -- 0.847 --

Column 19, Line 45, Claim 16:
Please correct "2500K." to read -- 2500K --

Column 20, Line 42, Claim 25:
Please correct "range:" to read -- range; --

Column 20, Line 44, Claim 25:
Please correct "range and" to read -- range and a --

Signed and Sealed this
Third Day of December, 2019

Andrei Iancu
*Director of the United States Patent and Trademark Office*